(12) United States Patent
Furukawa et al.

(10) Patent No.: US 7,038,299 B2
(45) Date of Patent: May 2, 2006

(54) SELECTIVE SYNTHESIS OF SEMICONDUCTING CARBON NANOTUBES

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US); Peter H. Mitchell, Jericho, VT (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 10/732,951

(22) Filed: Dec. 11, 2003

(65) Prior Publication Data

US 2005/0130341 A1    Jun. 16, 2005

(51) Int. Cl.
*H01L 29/12* (2006.01)
*H01L 29/06* (2006.01)
*H01L 21/205* (2006.01)
*H01L 21/64* (2006.01)

(52) U.S. Cl. ............... 257/613; 257/618; 438/478; 438/507; 977/DIG. 1

(58) Field of Classification Search ............ 438/478, 438/507; 257/613, 618
See application file for complete search history.

(56) References Cited

U.S. PATENT DOCUMENTS

| | | | |
|---|---|---|---|
| 6,250,984 B1 | 6/2001 | Jin et al. .................. 445/51 |
| 6,423,583 B1 | 7/2002 | Avouris et al. | |
| 6,515,325 B1 | 2/2003 | Farnworth et al. | |
| 6,858,891 B1 | 2/2005 | Farnworth et al. .......... 257/296 |
| 2002/0001905 A1 | 1/2002 | Choi et al. | |
| 2003/0132461 A1 | 7/2003 | Roesner et al. | |
| 2003/0168683 A1 | 9/2003 | Farnworth et al. | |
| 2003/0170930 A1 | 9/2003 | Choi et al. | |
| 2003/0178617 A1 | 9/2003 | Appenzeller et al. | |
| 2003/0205457 A1* | 11/2003 | Choi et al. .................. 204/164 |
| 2004/0137730 A1* | 7/2004 | Kim et al. .................. 438/689 |
| 2005/0064185 A1* | 3/2005 | Buretea et al. ............. 428/364 |
| 2005/0106846 A1* | 5/2005 | Dubin ........................ 438/585 |
| 2005/0129948 A1* | 6/2005 | Furukawa et al. .......... 428/408 |
| 2005/0167655 A1 | 8/2005 | Furukawa et al. | |
| 2005/0167740 A1 | 8/2005 | Furukawa et al. | |
| 2005/0167755 A1 | 8/2005 | Dubin et al. | |
| 2005/0179029 A1 | 8/2005 | Furukawa et al. | |

FOREIGN PATENT DOCUMENTS

EP     1420414      4/2005
WO    WO 2004/040616   3/2004

(Continued)

OTHER PUBLICATIONS

P. Harris, "Carbon Nanotubes and Related Structures," Cambridge University Press, 1999.

(Continued)

*Primary Examiner*—Evan Pert
(74) *Attorney, Agent, or Firm*—Wood, Herron & Evans

(57) ABSTRACT

Methods for selecting semiconducting carbon nanotubes from a random collection of conducting and semiconducting carbon nanotubes synthesized on multiple synthesis sites carried by a substrate and structures formed thereby. After an initial growth stage, synthesis sites bearing conducting carbon nanotubes are altered to discontinue synthesis at these specific synthesis sites and, thereby, halt lengthening of the conducting carbon nanotubes. Synthesis sites bearing semiconducting carbon nanotubes are unaffected by the alteration so that semiconducting carbon nanotubes may be lengthened to a greater length than the conducting carbon nanotubes.

65 Claims, 8 Drawing Sheets

FOREIGN PATENT DOCUMENTS

| | | |
|---|---|---|
| WO | WO 2004/040668 | 3/2004 |
| WO | WO 2004/105140 | 12/2004 |

OTHER PUBLICATIONS

K. Teo et al., "Catalytic Synthesis of Carbon Nanotubes and Nanofibers," Encyclopedia of Nanoscience and Nanotechnology, vol. X, pp. 1-22, 2003.

Y. Zhao et al., "Film Growth of Pillars of Multi-Walled Carbon Nanotubes," J. Phys.: Condens., Matter 15 (2003), L565-L569.

Y. Zhang et al., "Electric-Field-Directed Growth of Aligned Single-Walled Carbon Nanotubes," Applied Physics Letters, vol. 79, No. 19, Nov. 5, 2001.

"Synthesis of CNT's," http://nepp.nasa.gov/index_nasa.cfm/769/#synthesis.

C-H Kiang, "Growth of Large-Diameter Single-Walled Carbon Nanotubes," J. Phys. Chem. A 2000, 104, 2454-2456.

E. Ploenjes et al., "Single-Walled Nanotube Synthesis in CO Laser Pumped Carbon Monoxice Plasmas," Ohio State University, Oct. 10, 2001.

E. Ploenjes et al., "Synthesis of Single-Walled Carbon Nanotubes in Vibrationally Non-Equilibrium Carbon Monoxide," Chemical Physics Letters 352 (2002), Feb. 6, 2002, pp. 342-347.

Y. Mo et al., "The Growth Mechanism of Carbon Nanotubes from Thermal Cracking of Acetylene Over Nickel Catalyst Supported on Alumina," Elsevier Science B.V., 2001.

M. Jung et al., "Growth of Carbon Nanotubes by Chemical Vapor Deposition," Elsevier Science B.V., 2001.

H. W. Zhu et al., "Direct Synthesis of Long Single-Walled Carbon Nanotube Strands," Science, vol. 296, May 3, 2002.

H. Cui et al., "Growth Behavior of Carbon Nanotubes on Multilayered Metal Catalyst Film in Chemical Vapor Deposition," Chemical Physics Letters 374 (2003), pp. 222-228.

J. Li et al., "Highly-Ordered Carbon Nanotube Arrays for Electronics Applications," Applied Physics Letters, vol. 75, No. 3, Jul. 19, 1999, pp. 367-369.

P. Collins et al., "Engineering Carbon Nanotubes and Nanotube Circuits Using Electrical Breakdown," Science, vol. 292, Apr. 27, 2001, pp. 706-709.

V. Derycke et al., "Carbon Nanotube Inter- and Intramolecular Logic Gates," Nano Letters, xxxx, vol. 0, No. 0, A-D, received Aug. 16, 2001.

P. Collins et al., "Nanotubes for Electronics," Scientific American, Dec. 2000, pp. 62-69.

S. J. Wind et al., "Vertical Scaling of Carbon Nanotube Field-Effect Transistors Using Top Gate Electrodes," Applied Physics Letters, vol. 80, No. 20, May 20, 2002, pp. 3817-3819.

Z. F. Ren et al., "Growth, Characterization, and Potential Applications of Periodic Carbon Nanotube Arrays," Department of Physics, Boston College, updated 2001.

J. Li et al., "Bottom-Up Approach for Carbon Nanotube Interconnects," NASA Ames Research Center, received Dec. 5, 2002, accepted Jan. 31, 2003.

A. Cao et al., "Grapevine-Like Growth of Single Walled Carbon Nanotubes Among Vertically Aligned Multiwalled Nanotube Arrays," Applied Physics Letters, vol. 79, No. 9, Aug. 27, 2001, pp. 1252-1254.

"Carbon Nanotube Arrays: Synthesis of Dense Arrays of Well-Aligned Carbon Nanotubes Completely Filled with Titanium Carbide on Titanium Substrated," Battelle No. 12132.

A. Chang, "Integration of Nanotubes into Devices," National Nanofabrication Users Network, Stanford Nanofabrication Facility, p. 58.

Z. Huang et al., "Growth of Highly Oriented Carbon Nanotubes by Plasma-Enhanced Hot Filament Chemical Vapor Deposition," Applied Physics Letters, vol. 73, No. 26, Dec. 28, 1998, pp. 3845-3847.

Z. Ren et al., "Synthesis of Large Arrays of Well-Aligned Carbon Nanotubes on Glass," Science, vol. 282, Nov. 6, 1998, pp. 1105-1107.

Z. Ren et al., "Large Arrays of Well-Aligned Carbon Nanotubes," Proceedings of 13th International Winter School on Electronic Properties of Novel Materials, pp. 263-267, Feb. 27-Mar. 6, 1999, Kirchberg / Tirol, Austria.

Won Bong Choi et al., "Ultrahigh-Density Nanotransistors by Using Selectively Grown Vertical Carbon Nanotubes," Applied Physics Letters, vol. 79, No. 22, Nov. 26, 2001, pp. 3696-3698.

B. Zheng et al., "Efficient CVD Growth of Single-Walled Carbon Nanotubes on Surfaces Using Carbon Monoxide Precursor," Nano Letters, xxxx, vol. 0., No. 0, A-D, xxxx American Chemical Society, received Jun. 4, 2002, revised Jun. 26, 2002.

J. Gorman, "Nanoscale Networks: Superlong Nanotubes Can Form a Grid," Science News Online, May 3, 2003, vol. 163, No. 18.

"Tiny Nanotubes Set New Record," Nanotechweb.org, Aug. 7, 2003.

"IBM Scientists Develop Carbon Nanotube Transistor Technology," IBM.com News, news report concerning work published in Science, vol. 292, Issue 5517, Apr. 27, 2001 entitled "Engineering Carbon Nanotubes and Nanotube Circuits Using Electrical Breakdown" by Phaeton Avouris et al.

Georg S. Duesberg et al., *Large-Scale Integration of Carbon Nanotubes into Silicon Based Microelectronics*, Proceedings of SPIE vol. 5118 (2003), pp. 125-137.

* cited by examiner

SELECTIVE SYNTHESIS OF SEMICONDUCTING CARBON NANOTUBES

CROSS-REFERENCE TO RELATED APPLICATIONS

The present invention is related to U.S. Ser. No. 10/733,974, filed Dec. 11, 2003, U.S. Ser. No. 10/767,039 filed Jan. 29, 2004, U.S. Ser. No. 10/767,065, filed Jan. 29, 2004, and U.S. Ser. No. 10/777,576, filed Feb. 12, 2004.

FIELD OF THE INVENTION

The invention relates to semiconductor device fabrication and, more particularly, to a method for selecting semiconducting carbon nanotubes from among a collection of semiconducting and conducting carbon nanotubes.

BACKGROUND OF THE INVENTION

Traditional field effect transistors (FET's) are familiar conventional devices commonly incorporated as a fundamental building block into the intricate circuitry of integrated circuit (IC) chips. Downward scaling of FET dimensions has improved circuit performance and increased the functional capability of FET's packed on an IC chip. However, continued reductions in device dimensions may be hampered by the size limitations imposed by traditional materials and the costs associated with lithographic patterning to define device features.

Carbon nanotubes are nanoscale high-aspect-ratio cylinders consisting of hexagonal rings of carbon atoms that may assume either a semiconducting electronic state or a conducting electronic state. Semiconducting carbon nanotubes have been used to form hybrid devices, such as hybrid FET's. In particular, FET's have been fabricated using a single semiconducting carbon nanotube as a channel region and forming ohmic contacts at opposite ends of the semiconducting carbon nanotube extending between a gold source electrode and a gold drain electrode situated on the surface of a substrate. A gate electrode is defined in the substrate underlying the carbon nanotube and generally between the source and drain electrodes. An oxidized surface of the substrate defines a gate dielectric situated between the buried gate electrode and the carbon nanotube. Such FET's should switch reliably while consuming significantly less power than a comparable silicon-based device structure due to the small dimensions of the carbon nanotube.

Synthesized carbon nanotubes randomly form in a mixture or collection of conducting and semiconducting electronic states when grown by conventional synthesis processes. Unfortunately, no conventional synthesis process is capable of exclusively growing semiconducting carbon nanotubes or, for that matter, growing only conducting carbon nanotubes. Therefore, semiconducting carbon nanotubes and/or conducting carbon nanotubes must be individually sorted by a painstaking post-synthesis operation from commingled mixtures of conducting and semiconducting carbon nanotubes. The inability to effectively separate nanotubes of different electronic states has hindered the maturation of carbon nanotube hybrid device structures.

What is needed, therefore, is a method of effectively removing conducting carbon nanotubes from a random collection of conducting and semiconducting carbon nanotubes.

SUMMARY OF THE INVENTION

In accordance with the principles of the invention, a method for producing semiconducting carbon nanotubes includes synthesizing conducting carbon nanotubes to a first length on a first plurality of synthesis sites carried by a substrate and synthesizing semiconducting carbon nanotubes to a second length on a second plurality of synthesis sites carried by the substrate. The second length of the semiconducting carbon nanotubes is greater than the first length of the conducting carbon nanotubes.

In a specific embodiment of the invention, conducting carbon nanotubes are synthesized on a first plurality of synthesis sites on a substrate and semiconducting carbon nanotubes are synthesized on a second plurality of synthesis sites on the substrate. The growth of the conducting carbon nanotubes and the semiconducting carbon nanotubes is interrupted or temporarily suspended and the first plurality of synthesis sites is altered such that nanotube synthesis is no longer supported. Thereafter, the synthesis of the semiconducting carbon nanotubes is resumed at the second plurality of synthesis sites to lengthen carbon nanotubes characterized by the semiconducting electronic state relative to conducting carbon nanotubes.

In another specific embodiment of the invention, conducting carbon nanotubes are synthesized on a first plurality of synthesis sites carried by a substrate and semiconducting carbon nanotubes are synthesized on a third plurality of synthesis sites carried by the substrate. Each of the conducting carbon nanotubes includes one of a second plurality of synthesis sites at a corresponding free end and each of the semiconducting carbon nanotubes includes one of a fourth plurality of synthesis sites at a corresponding free end. The synthesis of the conducting and the semiconducting carbon nanotubes is interrupted. Thereafter, a prophylactic barrier is formed to prevent resumed synthesis of the conducting and semiconducting carbon nanotubes at the first and third pluralities of synthesis sites, respectively. The second plurality of synthesis sites are then altered to prevent resumed synthesis of the conducting carbon nanotubes. Synthesis of the semiconducting carbon nanotubes is resumed at the fourth plurality of synthesis sites to lengthen the semiconducting carbon nanotubes relative to the conducting carbon nanotubes.

In another aspect of the invention, a structure is provided that includes a substrate carrying a plurality of first and a plurality of second synthesis sites each configured for synthesizing carbon nanotubes. The structure further includes a plurality of semiconducting carbon nanotubes each carried by one of the first plurality of synthesis sites and a plurality of conducting carbon nanotubes each carried by one of the second plurality of synthesis sites. Each of the plurality of conducting carbon nanotubes is characterized by a first length less than a second length characterizing each of the plurality of semiconducting carbon nanotubes.

Semiconducting carbon nanotubes may be produced and harvested in large numbers using the simplified preparation process in accordance with the principles of the invention. The invention in its various embodiments fulfills a need for post-synthesis selection of semiconducting carbon nanotubes from conducting carbon nanotubes without painstaking sorting of individual carbon nanotubes. Moreover, the post-synthesis sorting of semiconducting carbon nanotubes from conducting carbon nanotubes is accomplished by a relatively low-current electrolysis process in which electrical current does not flow through the semiconducting nanotubes. Therefore, the selection process should not damage, harm or otherwise degrade the properties of the semiconducting nanotubes.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

The invention in its various embodiments provides methods for selecting semiconducting carbon nanotubes from among a population of carbon nanotubes with random conducting and semiconducting electronic states synthesized or grown by chemical vapor deposition on seed pads of a growth-promoting catalytic material. The selection process includes temporarily discontinuing nanotube synthesis while the nanotubes are relatively short and altering the seed pads bearing conductive carbon nanotubes by, for example, either removing the associated seed pad or plating over the catalytic material of the associated seed pad. Subsequently, synthesis is re-initiated to lengthen the semiconducting carbon nanotubes, which are either harvested for use or incorporated directly into a device structure. The conductive carbon nanotubes cannot lengthen as the associated seed pads are either absent or no longer support nanotube synthesis.

Figure 1:
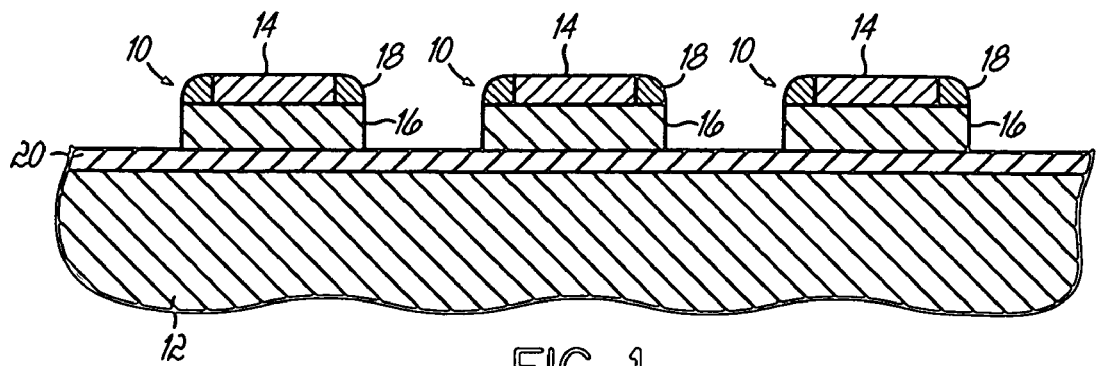
FIGS. 1–10 are cross-sectional views of a portion of a substrate at various stages of an embodiment of a processing method in accordance with principles of the invention.

With reference to FIG. 1, a plurality of spaced-apart synthesis sites 10 is provided on a substrate 12. The synthesis sites 10 may be arranged, for example, in a periodic array of rows and columns extending about the surface of substrate 12. Each synthesis site 10 includes a seed pad 14 of a catalytic material suitable for synthesizing carbon nanotubes (FIG. 2) positioned on an upper surface of a mesa or pillar 16. Substrate 12 may be composed of any suitable semiconductor substrate material, including but not limited to, silicon (Si) and gallium arsenide (GaAs), or other materials such as metals. Encircling the periphery of the seed pad 14 is a spacer 18 composed of a material that does not support the synthesis or growth of carbon nanotubes. Underlying the synthesis sites 10 is a release layer 20 that may also function as an etch stop, although a distinct etch stop layer (not shown) may be provided in addition to the release layer 20. A cleaving plane is defined along the horizontal plane of the release layer 20.

In one embodiment of the invention, the release layer 20 is formed in a substrate 12 composed of silicon. One suitable release layer 20 consists of gas-filled spaces fashioned by ion implanting a buried layer of hydrogen or an inert gas and then annealing under suitable conditions to cause gas accumulation as recognized by a person of ordinary skill in the art. The patterned seed pads 14 may be formed by depositing a blanket layer of the catalytic material on the insulating layer 12 by any conventional deposition technique including, but not limited to, chemical vapor deposition (CVD) using suitable precursors such as metal halides and metal carbonyls, sputtering, and physical vapor deposition (PVD) and then employing a standard lithographic and subtractive etch process to pattern the blanket layer. The spacers 18 are formed about the seed pads 14 by a standard lithographic and etch process. The spaced-apart pillars 16 are then defined by performing a self-aligned anisotropic etch that relies on the seed pads 14 and spacers 18 as a mask and that etches the material of substrate 12 selective to the material constituting seed pads 14 and spacers 18 to the depth of the release layer 20.

The catalytic material in catalyst pads 10 is any material capable of nucleating and supporting the growth of carbon nanotubes when exposed to appropriate reactants under chemical reaction conditions suitable to promote nanotube growth. For example, suitable catalytic materials include, but are not limited to, iron, platinum, nickel, cobalt, compounds of each of these metals, and alloys of each of these metals such as metal suicides.

References herein to terms such as "vertical", "horizontal", etc. are made by way of example, and not by way of limitation, to establish a frame of reference. The term "horizontal" as used herein is defined as a plane parallel to the conventional plane or surface of substrate 12, regardless of orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood various other frames of reference may be employed without departing from the spirit and scope of the invention.

Figure 2:
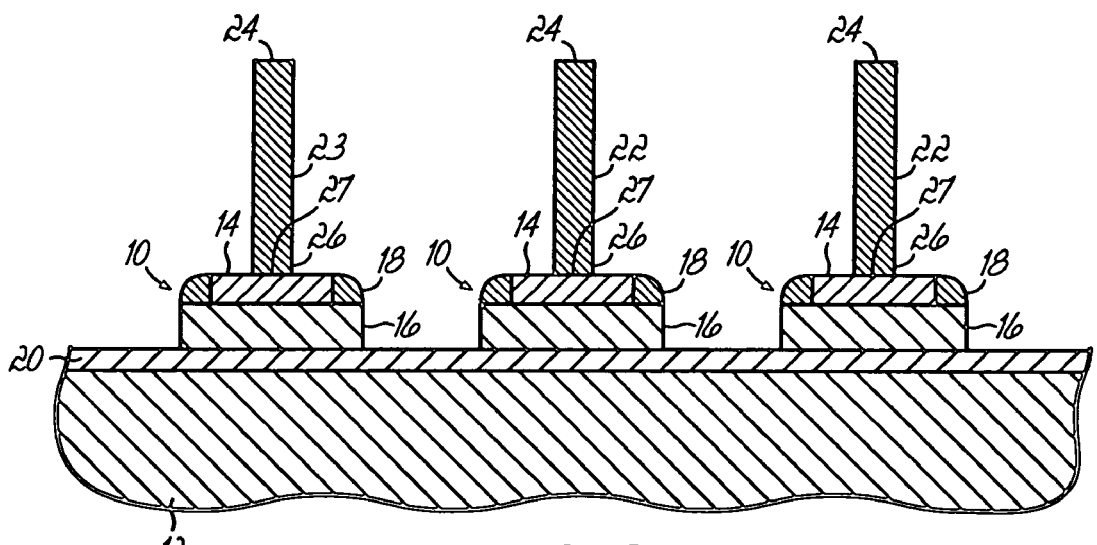

With reference to FIG. 2, carbon nanotubes 22, 23 are grown or otherwise synthesized on seed pads 14 by any suitable growth technique. Synthesis of the carbon nanotubes 22, 23 is suspended when a relatively-short average length is attained. In one embodiment of the invention, synthesis is discontinued when the carbon nanotubes 22, 23 have an average length in the range of about 100 nm to about 200 nm. Carbon nanotubes 22 are characterized by the semiconducting electronic state and carbon nanotubes 23 are characterized by the conducting electronic state. The specific length at which synthesis is temporarily suspended is shorter than the ultimate length of the semiconducting nanotubes 22 after nanotube synthesis is selectively resumed for carbon nanotubes 22 without lengthening carbon nanotubes 23, as described herein. The spacer 18 prevents lateral or horizontal nanotube synthesis from the sides of the seed pad 14.

Preferably, the surface area of the seed pads 14 is limited or the synthesis conditions are tailored such that each seed pad 14 supports the synthesis of only a single carbon nanotube 22 or a single carbon nanotube 23, although the invention is not so limited. Seed pads 14 may carry multiple carbon nanotubes 22, multiple carbon nanotubes 23, or a mixture of carbon nanotubes 22 and carbon nanotubes 23. The synthesis sites 10 with seed pads 14 bearing either multiple carbon nanotubes 23 or a mixture of carbon nanotubes 22 and carbon nanotubes 23 are altered, as described herein, to prevent continued synthesis of conducting carbon nanotubes 23 as the presence of conducting carbon nanotubes 23 contributes to synthesis site 10 alteration.

In one embodiment of the invention, the carbon nanotubes 22, 23 are grown by chemical vapor deposition (CVD) or plasma-enhanced CVD using any suitable gaseous or vaporized carbonaceous reactant including, but not limited to, carbon monoxide (CO), ethylene ($C_2H_4$), methane ($CH_4$), acetylene ($C_2H_4$), a mixture of acetylene and ammonia ($NH_3$), a mixture of acetylene and nitrogen ($N_2$), a mixture of acetylene and hydrogen ($H_2$), xylene ($C_6H_4(CH_3)_2$), and a mixture of xylene and ferrocene ($Fe(C_5H_5)_2$) under growth conditions suitable for promoting carbon nanotube growth on the catalytic material forming the seed pad 14. Substrate 12 may be heated to a temperature adequate to promote and/or hasten CVD growth. The reactant is delivered or supplied to each seed pad 14, where the reactant chemically reacts with the catalyst material to nucleate carbon nanotubes 22, 23 and to sustain their growth following nucleation. The catalyst material of the seed pads 14 participates in carbon nanotube synthesis without itself being transformed or consumed by the chemical reaction transpiring at its exposed surface by reducing the activation energy of the reaction forming carbon nanotubes 22, 23. The carbon nanotubes 22, 23 grow in a collection or population that randomly have either a semiconducting electronic state or a conducting electronic state, as the electronic state may not be selected during growth and, hence, the electronic state of any given nanotube 22, 23 on a given seed pad 14 cannot be predicted.

The carbon nanotubes 22, 23 constitute hollow cylindrical tubes composed of precisely arranged hexagonal rings of bonded carbon atoms, in which carbon nanotubes 22 are characterized by a semiconducting electronic state and the carbon nanotubes 23 are characterized by a conducting electronic state. The cylindrical tubes may have a diameter ranging from about 0.5 nm to about 100 nm and may have a sidewall thickness of about 0.2 nm to about 3 nm. The carbon nanotubes 22, 23 may be multi-wall nanotubes resembling concentric cylinders or may be single-wall nanotubes.

The carbon nanotubes 22, 23 extend on average substantially vertically upward from the seed pad 14 with a perpendicular or, at the least, approximately perpendicular orientation to the horizontal surface of the seed pad 14. The carbon nanotubes 22, 23 are expected to have a statistical distribution of heights or lengths each measured between a free end or leading tip 24 and a base 26 electrically coupled with the corresponding seed pad 14. Growth is expected to occur by addition of carbon atoms at an interface 27 between each of the carbon nanotubes 22, 23 and the corresponding seed pad 14. The invention contemplates that one or all of the carbon nanotubes 22, 23 may be tilted slightly from the vertical direction, as defined herein, and that the nanotube orientation may be characterized by a statistical distribution that, on average, is substantially vertical.

Figure 3:
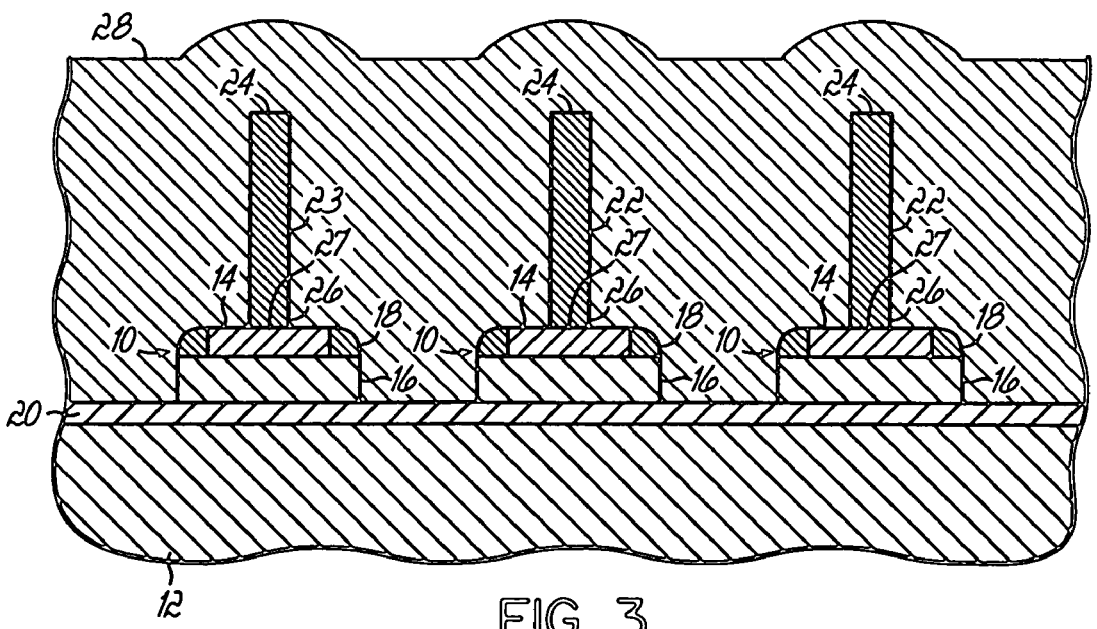

With reference to FIG. 3, a dielectric layer 28 is conformally deposited on substrate 12 with a thickness that completely covers the carbon nanotubes 22, 23 and fills the spaces between adjacent synthesis sites 10. Dielectric layer 28 may be constituted by silicon dioxide ($SiO_2$) deposited by a low pressure chemical vapor deposition (LPCVD) process using tetraethylorthosilicate (TEOS) as the silicon precursor source. Many other materials may be used instead of TEOS-based oxide, as long as electrical isolation is ensured.

Figure 4:
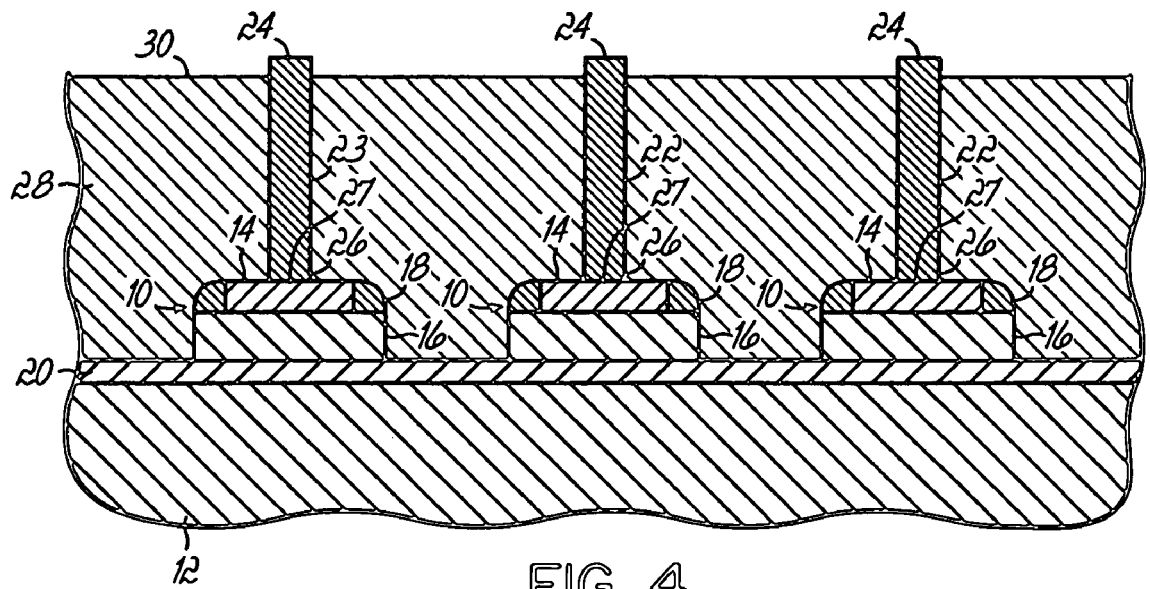

With reference to FIG. 4, an exposed surface 30 of the dielectric layer 28 is polished flat by a chemical-mechanical polishing (CMP) process or any other suitable planarization technique. Generally, CMP processes involve a polishing or mechanical abrasion action aided chemically by a suitable slurry introduced between a polishing pad and dielectric layer 28. The leading tips 24 of the carbon nanotubes 22, 23 may be exposed by the polishing operation. However, a separate etch process may be used to selectively remove the dielectric layer 28 relative to the carbon nanotubes 22, 23 so that the leading tips 24 project vertically above the recessed exposed surface 30. Techniques suitable for recessing exposed surface 30 include reactive ion etching (RIE) and wet etching with a suitable aqueous etchant solution.

Figure 5:
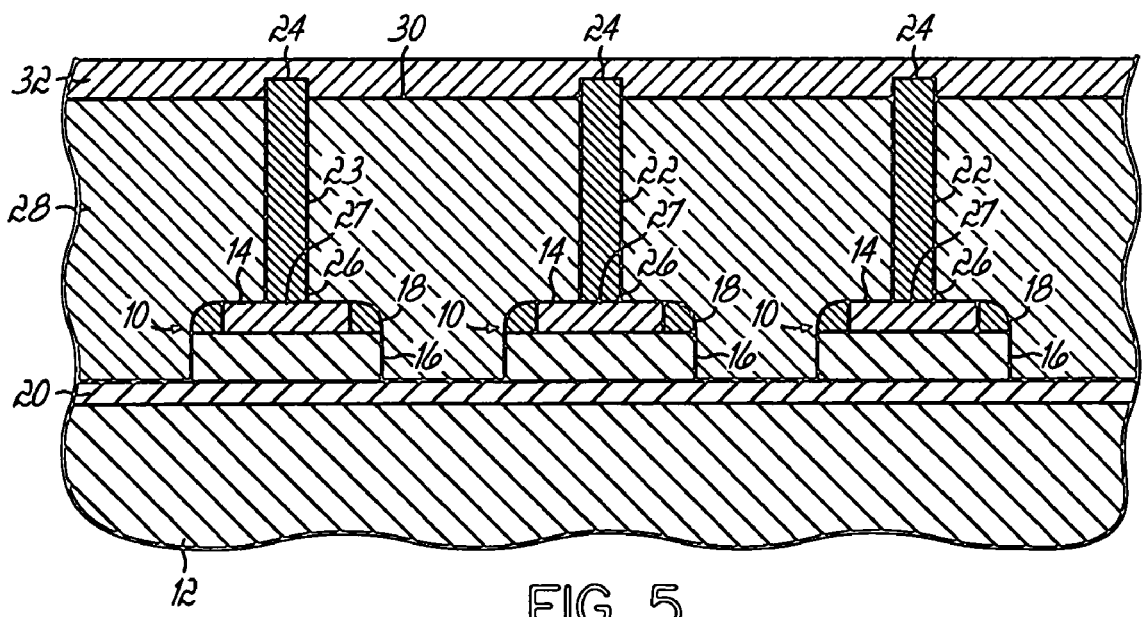

With reference to FIG. 5, a layer 32 of a conducting material is deposited on the exposed surface 30 of the dielectric layer 28 to supply an electrical contact, preferably ohmic, with the carbon nanotubes 22, 23. Layer 32 may be composed of any suitable conducting material including, but not limited to, aluminum (Al), copper (Cu), gold (Au), molybdenum (Mo), tantalum (Ta), titanium (Ti), and tungsten (W), that is inert relative to the material forming carbon nanotubes 22, 23. Layer 32 may be deposited by any suitable deposition process such as PVD, sputtering, or CVD by thermal decomposition/thermolysis of a metal-containing precursor such as metal halides and metal carbonyls.

Figure 6:
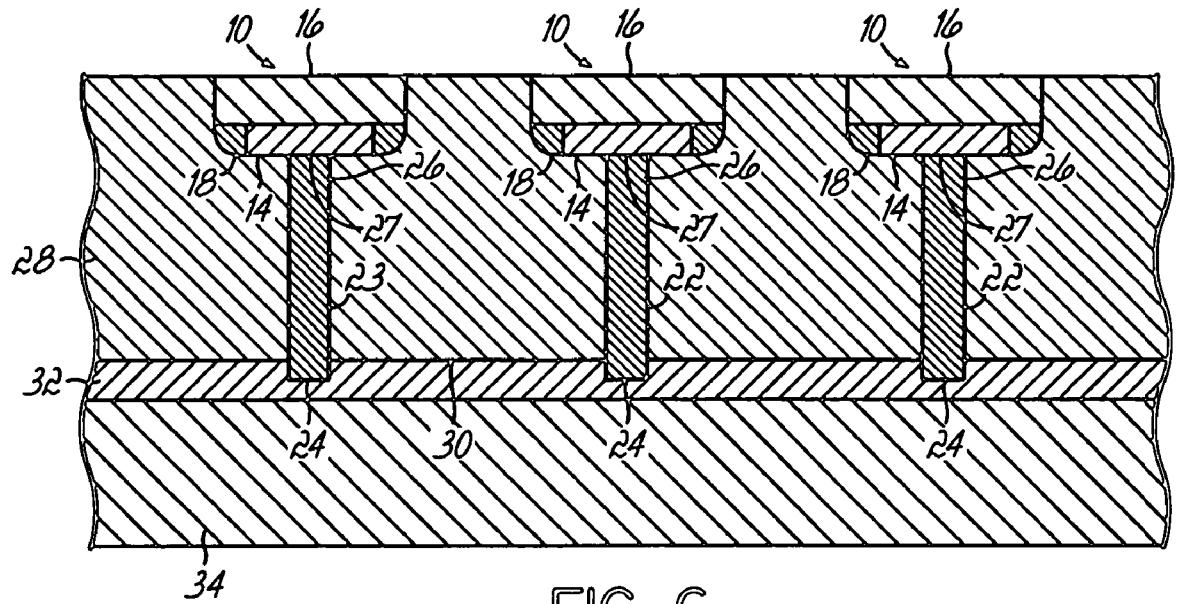

With reference to FIG. 6, a handle wafer 34 is bonded with layer 32 by any conventional technique familiar to persons of ordinary skill in the art. The handle wafer 34 may be, for example, a silicon wafer or a metallic wafer. The handle wafer 34 may be bonded with layer 32, for example, using a layer of high temperature adhesive or by a suitable heat treatment. The handle wafer 34 may be optionally oxide coated or coated with other layers (not shown) to aid bonding. Substrate 12 is then removed by way of release layer 20 so that the synthesis sites 10 and dielectric layer 28 remain behind so that the handle wafer 34 provides the requisite mechanical support for the residual structural components.

Figure 7:
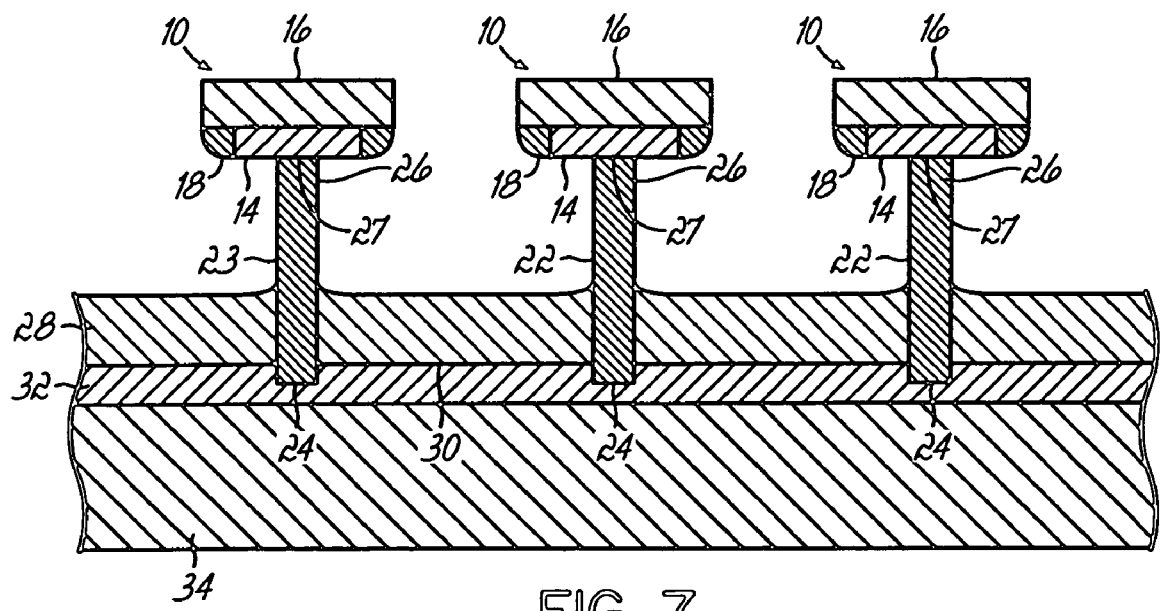

With reference to FIG. 7, the dielectric layer 28 is removed to a depth that exposes the seed pads 14 and the corresponding interface 27 between each carbon nanotube 22, 23 and the corresponding one of the seed pads 14. One technique for selectively removing dielectric layer 28 relative to the materials in the synthesis sites 10 and the carbon nanotubes 22, 23 is isotropic wet etching with a suitable aqueous etchant solution, such as a buffered hydrofluoric acid (HF) solution. The nanotubes 22, 23 and the associated synthesis sites 10 form freestanding structures extending substantially vertically relative to the handle wafer 34. An unobstructed fluid path exists to the base 26 of each carbon nanotube 22, 23 and the interface 27 between each base 26 and the associated seed pad 14.

Figure 8:
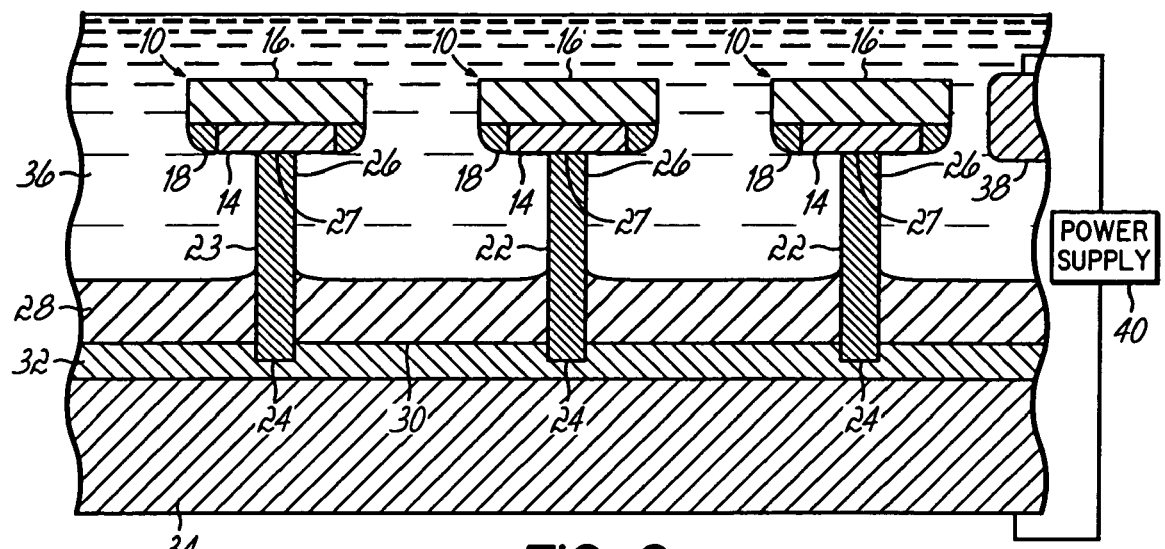

With reference to FIG. 8, synthesis sites 10 bearing conducting carbon nanotubes 23 or, if present, a mixture of carbon nanotubes 22 and carbon nanotubes 23 are disabled or altered in accordance with the principles of the invention. To that end and in one embodiment of the invention, the handle wafer 34 is immersed in an electrolytic bath or solution 36 and a potential difference is applied between the handle wafer 34 and a second electrode 38. The handle wafer 34 and the second electrode 38 operate as an anode and cathode in an electrical circuit electrically coupled with a power supply 40. The applied potential difference causes an electrical current to flow between the handle wafer 34 and the second electrode 38 in a closed current path including the electrolytic solution 36, the conducting nanotubes 23, and the synthesis sites 10 bearing the conducting carbon nanotubes 23. The resulting current flow in the closed electrical circuit causes electrolytic etching of the seed pad 14 carrying the conducting carbon nanotubes 23 manifested by the liberation of catalyst material of seed pad 14 into the electrolytic solution 36. The electrolytic etching typically alters each interface 27 with each of the conducting carbon nanotubes 23 such that the residual synthesis site 10 is removed from the corresponding base 26. Nanotube synthesis may no longer occur at these specific synthesis sites 10 as the base 26 of each conducting carbon nanotube 23 lacks a seed pad 14 of catalytic material that would support nanotube synthesis or growth.

In certain alternative embodiments of the invention, the identity of the anode and cathode may be swapped and an electrolytic plating process may be used to poison or plate the catalyst material of seed pads 14 bearing conducting carbon nanotubes 23 so that continued synthesis is prevented, rather than the separation and removal of the corresponding synthesis sites 10 described above. Specifically, the plating operates as a prophylactic barrier that shields the seed pads 14 from reactants during subsequent resumed nanotube synthesis so that additional growth and lengthening of conducting carbon nanotubes 23 does not occur or, if growth does occur, is insignificant relative to the lengthening of the semiconducting nanotubes 22. The material constituting the plating should not support nanotube growth.

Process parameters, including but not limited to, voltage, temperature, current density, and the composition and viscosity of the electrolytic solution 36, are selected that are appropriate for electrolytically etching the catalyst material forming seed pad 14 at an efficient etching rate without harming or otherwise damaging the semiconducting carbon nanotubes 22 on those synthesis sites 10 bearing only semiconducting carbon nanotubes 22. For example, one electrolytic solution suitable for dissolving seed pads 14 of cobalt alloys, when current is applied, is composed of 83 vol % methanol ($CH_3OH$), 3 vol % nitric acid ($HNO_3$), 7 vol % sulfuric acid ($H_2SO_4$), 2 vol % hydrofluoric acid (HF), and 5 vol % lactic acid ($CH_3CHOHCO_2H$) cooled to −70° C. It should be recognized, however, that the concentration and composition of electrolytic solution 36 can vary depending on the particular composition of the seed pads 14. Generally, the electrolytic solution 36 is expected to contain at least one acid selected from among hydrochloric acid, nitric acid, sulfuric acid, and phosphoric acid.

Synthesis sites 10 associated with the semiconducting carbon nanotubes 22 are unaffected by the process removing the synthesis sites 10 bearing conducting carbon nanotubes 23. Specifically, current does not flow through carbon nanotubes 22 characterized by the semiconducting electronic state to define an open electrical circuit. As a result, the seed pads 14 of these specific synthesis sites 10 remain intact and capable of resuming semiconducting nanotube growth when reactant flow is resumed to the interface 27 between the base 26 of the semiconducting carbon nanotubes 22 and their corresponding seed pads 14.

Figure 9:
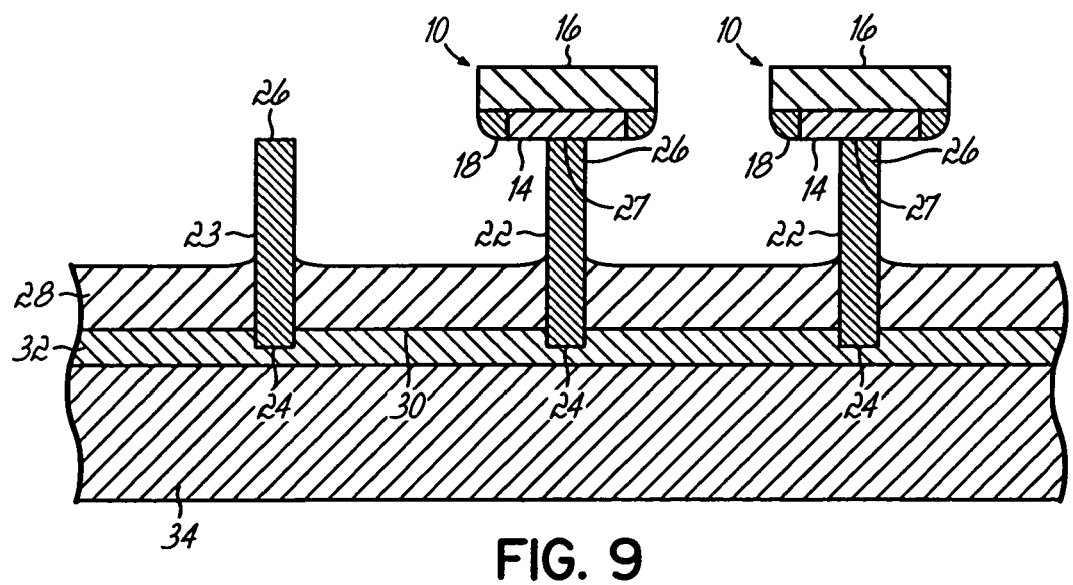
Figure 10:
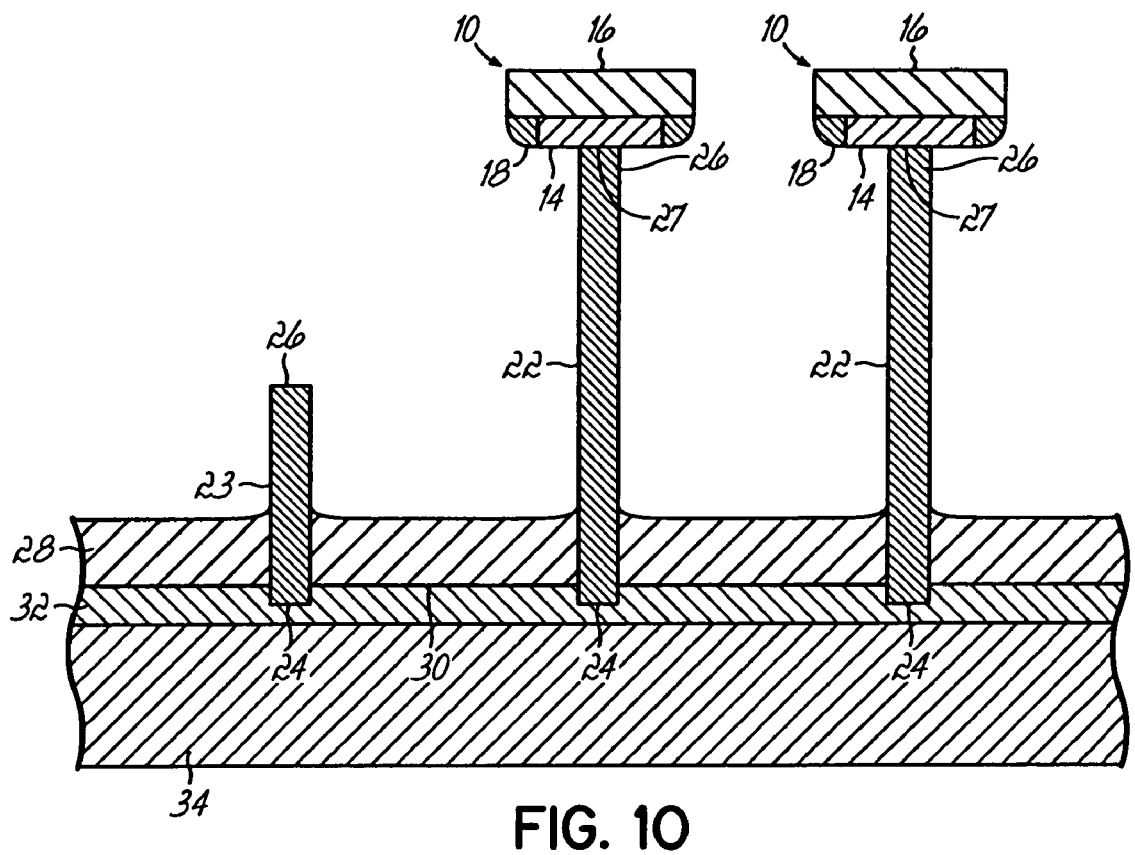

With reference to FIGS. 9 and 10, after the handle wafer 34 is removed from the electrolytic solution 36 (FIG. 8), the growth of the semiconducting carbon nanotubes 22 is reinitiated by supplying the growth reactant at the interface 27 with the associated seed pads 14. Growth proceeds at the same interface 27 with the catalyst material as active in formation of original shorter semiconducting carbon nanotubes 22. The environment about the interface 27 remains constant as the semiconducting carbon nanotubes 22 lengthen. In other words, as the semiconducting carbon nanotubes 22 lengthen, the fluid path to the interface between nanotubes 22 and the associated seed pads 14 is not occluded or otherwise modified by the growth process. As a result, growth proceeds unimpeded by the lengthening nanotubes 22. Conductive carbon nanotubes 23 do not lengthen because the associated seed pads 14 required for synthesizing nanotube growth are either absent, as illustrated in FIGS. 9 and 10, or the catalyst material of those seed pads 14 has been altered to block or defeat the catalytic properties such that nanotube synthesis cannot occur. Although the lengthening of the conducting carbon nanotubes 23 is prevented or otherwise stymied, the semiconducting carbon nanotubes 22 lengthen significantly selective to the conductive carbon nanotubes 23.

The semiconducting carbon nanotubes 22 are grown to a desired length and then harvested by excising the synthesis sites 10 and removal from the handle wafer 34 for use in forming microelectronic devices or other structures, such as an array of emitters for a field effect display. The harvested semiconducting carbon nanotubes 22 may be discerned from conducting carbon nanotubes 23 by a sorting method sensitive to the significant length differential or, alternatively, the harvesting technique may displace only the more lengthy semiconducting carbon nanotubes 22 while leaving the shorter conducting carbon nanotubes attached to substrate 12. Alternatively, a device structure incorporating the semiconducting carbon nanotubes 22 may be fabricated directly on the handle wafer 34.

Figure 11:
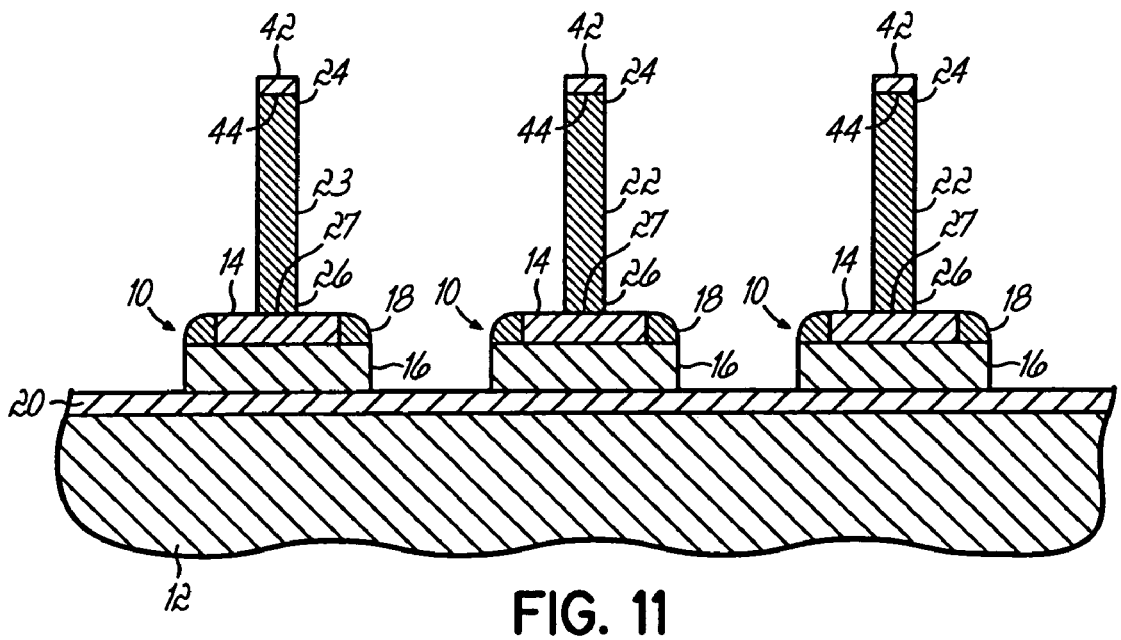
FIGS. 11–16 are cross-sectional views of a portion of a substrate at various stages of an alternative embodiment of a processing method in accordance with principles of the invention.

With reference to FIG. 11 in which like reference numerals refer to like features in FIGS. 1–10 and in accordance with an alternative embodiment of the invention, carbon nanotubes 22, 23 are grown on seed pads 14 by any suitable growth technique and growth is suspended when a relatively-short average length is attained. During the growth process, a seed cap 42 of catalytic material originating from seed pads 14 attaches to and covers the leading tip 24 of each of the carbon nanotubes 22, 23 at a stage analogous to FIG. 2 at which nanotube growth is temporarily halted. The leading tip 24 and the seed cap 42 are coextensive at an interface 44 at which nanotube growth may transpire. The invention contemplates that, during this stage, nanotube synthesis may occur at the interface 27 with seed pad 14 and/or at the interface 44 with the seed cap 42, which operates as another synthesis site.

Figure 12:
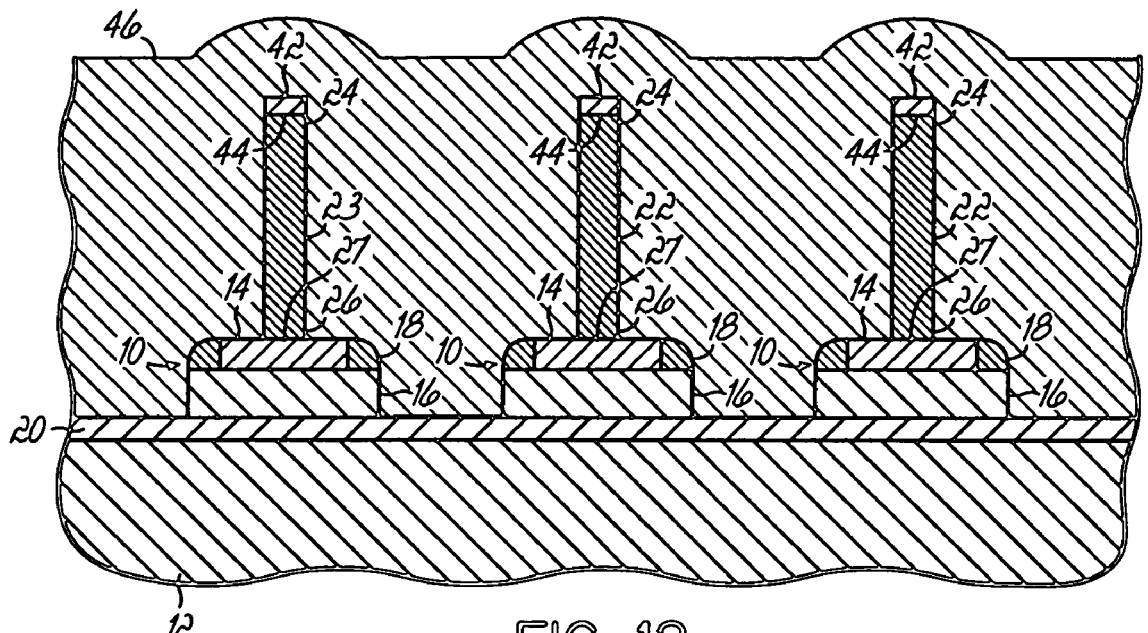

With reference to FIG. 12, a dielectric layer 46 of, for example, TEOS-based oxide is conformally deposited on substrate 12. The dielectric layer 46 is characterized by a thickness that completely covers the carbon nanotubes 22, 23 and fills the spaces between adjacent synthesis sites 10. Many other insulating materials may be used instead of TEOS-based oxide, as long as electrical isolation and liquid impermeability is ensured.

Figure 13:
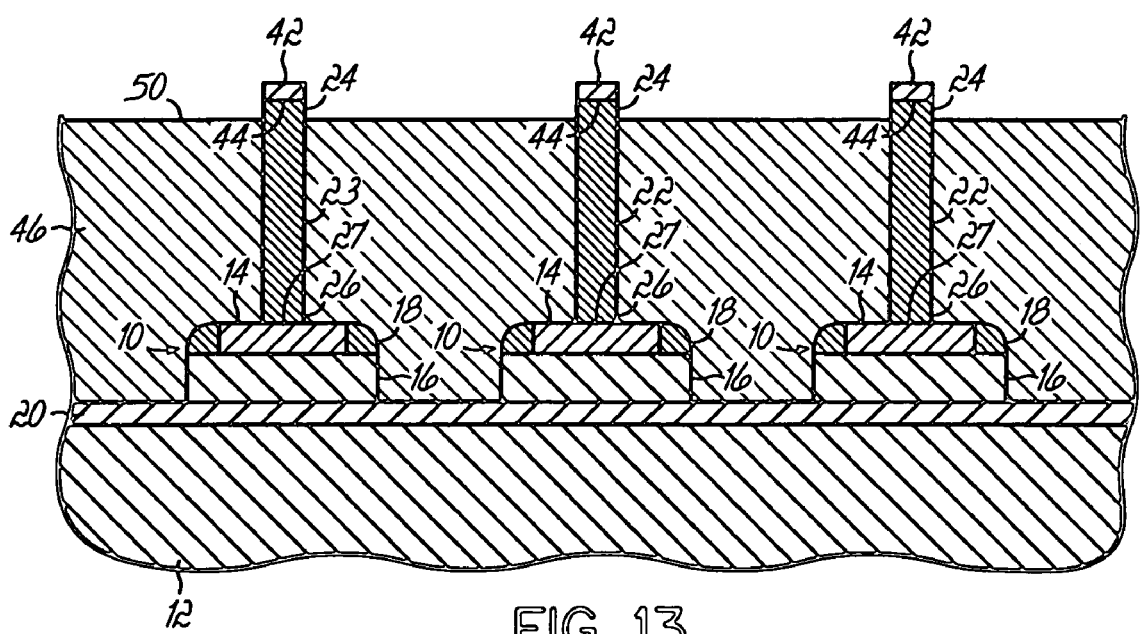

With reference to FIG. 13, the dielectric layer 46 is removed by, for example, RIE or wet etching to a depth that exposes the seed caps 42 and corresponding interface 44 between each carbon nanotube 22, 23 and the corresponding one of the seed caps 42. The capped nanotubes 22, 23 project vertically above a recessed surface 50 of the dielectric layer 46. An unobstructed fluid path exists to the interface 44 between each nanotube 22, 23 and the corresponding one of the seed caps 42. The original synthesis sites 10 are buried in the dielectric layer 46 such that nanotube synthesis cannot re-occur on the original growth interface 27 between the base 26 of each carbon nanotube 22, 23 and the associated seed pad 14. Specifically, the coverage of the synthesis sites 10 by the dielectric layer 46 defines a prophylactic barrier that eliminates fluid paths to the synthesis sites 10.

Figure 14:
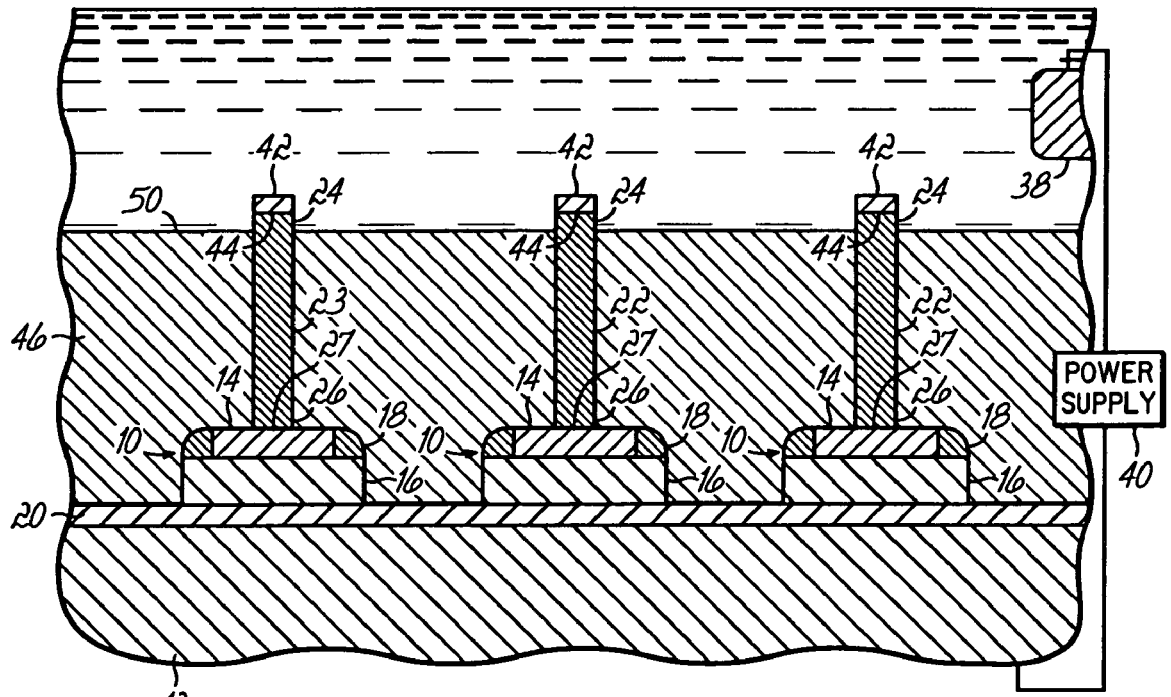

With reference to FIG. 14, seed caps 42 on conducting carbon nanotubes 23 are altered in accordance with the principles of the invention such that nanotube synthesis cannot occur at the interface 44. To that end and in one embodiment of the invention, the substrate 12 is immersed in electrolytic solution 36 and a potential difference is applied between substrate 12 and the second electrode 38. The applied potential difference causes an electrical current to flow between the substrate 12 and the second electrode 38 in a closed current path or electrical circuit including the electrolytic solution 36, the conducting nanotubes 23, and the seed caps 42 covering conducting carbon nanotubes 23. Accordingly, the substrate 12 and release layer 20 must both be electrically conductive to participate in the closed current path. The resulting current flow in the closed electrical circuit induces etching of the seed caps 42 bearing the conducting carbon nanotubes 23. The seed caps 42 are either etched away or the seed caps 42 are dissolved or attacked at interface 44 so that each seed cap 42 is removed from the leading tip 24 of the conducting carbon nanotubes 23 and released into the electrolytic solution 36.

Alternatively, the invention contemplates that the identity of the anode and cathode in the electrical circuit may be exchanged so that an electrolytic plating process covers the seed caps 42 on conducting carbon nanotubes 23 with a prophylactic barrier consisting of a plating layer. The barrier action of the plating layer prevents nanotube synthesis at the respective interfaces 44 with each conducting carbon nanotube 23 by shielding the seed caps 42 from reactants so that additional growth and lengthening of conducting carbon nanotubes 23 does not occur or, if growth does occur, is insignificant relative to the lengthening of the semiconducting nanotubes 22. The material constituting the plating should not support nanotube growth.

Figure 15:
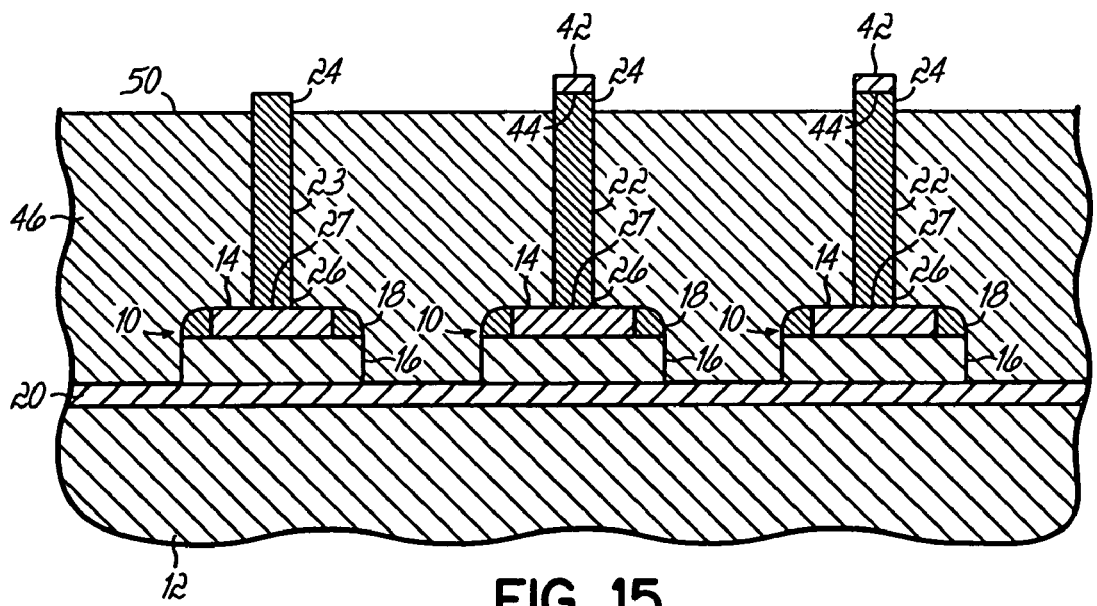
Figure 16:
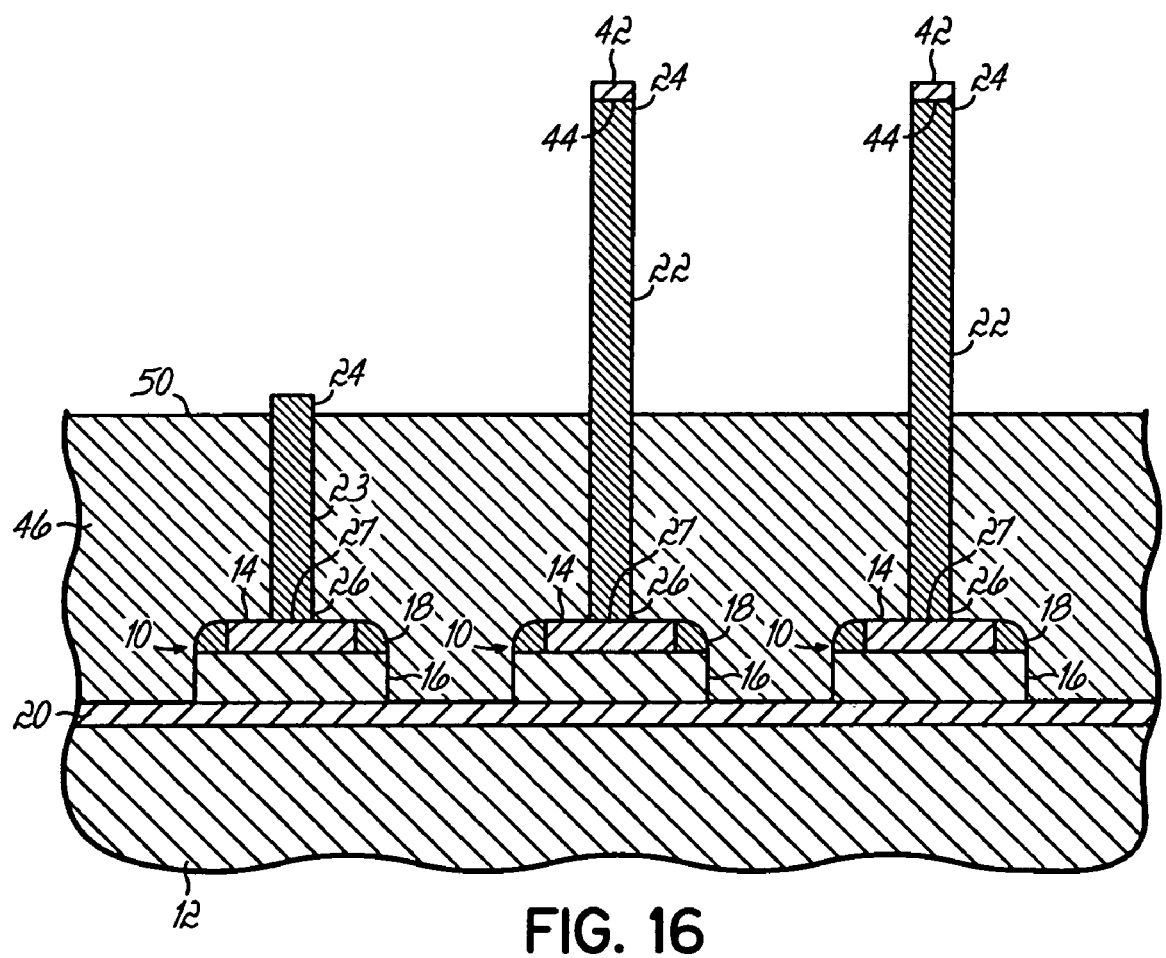

With reference to FIGS. 15 and 16, after the substrate 12 is removed from the electrolytic solution 36 (FIG. 8), the growth of the semiconducting carbon nanotubes 22 is reinitiated by supplying the growth reactant at each interface 44 with the associated seed caps 42, which operate as synthesis sites. Conductive carbon nanotubes 23 do not lengthen because the associated seed caps 42 required for synthesizing nanotube growth are either absent, as illustrated in FIGS. 15 and 16, or the catalyst material of those seed caps 42 has been altered to block or defeat the catalytic properties such that nanotube synthesis cannot occur. Nanotube synthesis cannot occur at the original synthesis sites 10, which are buried in the dielectric layer 46.

Although the lengthening of the conducting carbon nanotubes 23 is prevented or otherwise stymied, the semiconducting carbon nanotubes 22 lengthen significantly selective to the conductive carbon nanotubes 23. After a desired length is attained, the semiconducting carbon nanotubes 22 are either harvested or used in a device structure while remaining attached to substrate 12. The harvested semiconducting carbon nanotubes 22 may be discerned by a sorting method sensitive to the significant length differential or, alternatively, the harvesting technique may remove only the more lengthy semiconducting carbon nanotubes 22 while leaving the shorter conducting carbon nanotubes 23 attached to substrate 12. Alternatively, a device structure incorporating the semiconducting carbon nanotubes 22 may be fabricated directly on substrate 12.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for producing semiconducting carbon nanotubes, comprising:

synthesizing conducting carbon nanotubes to a first length on a first plurality of synthesis sites carried by a substrate; and synthesizing semiconducting carbon nanotubes to a second length on a second plurality of synthesis sites carried by the substrate, the second length of the semiconducting carbon nanotubes being greater than the first length of the conducting carbon nanotubes.

2. The method of claim 1 wherein synthesizing the conducting carbon nanotubes occurs concurrently with synthesizing the semiconducting carbon nanotubes.

3. The method of claim 1 wherein synthesizing the conducting carbon nanotubes further comprises:

orienting each of the conducting carbon nanotubes substantially vertically to a corresponding one of the first plurality of synthesis sites during synthesis.

4. The method of claim 1 wherein synthesizing the semiconducting carbon nanotubes further comprises:

orienting each of the semiconducting carbon nanotubes substantially vertically to a corresponding one of the second plurality of synthesis sites during synthesis.

5. The method of claim 1 wherein synthesizing conducting carbon nanotubes further comprises:

altering the first plurality of synthesis sites, after the first length is attained, to prevent synthesis of the conducting carbon nanotubes.

6. The method of claim 5 wherein altering the first plurality of synthesis sites comprises:

electrolytically etching the first plurality of synthesis sites, after the first length is attained, to an extent sufficient to prevent synthesis of the conducting carbon nanotubes.

7. The method of claim 1 wherein the second length is at least twice as long as the first length.

8. The method of claim 1 wherein a single semiconducting carbon nanotube is carried by each of the second plurality of synthesis sites.

9. The method of claim 1 wherein synthesizing conducting carbon nanotubes comprises:

performing a chemical vapor deposition process on a catalyst material carried by each of the first plurality of synthesis sites.

10. The method of claim 1 wherein synthesizing semiconducting carbon nanotubes comprises:

performing a chemical vapor deposition process on a catalyst material carried by each of the second plurality of synthesis sites.

11. The method of claim 1 further comprising:

harvesting the semiconducting carbon nanotubes.

12. The method of claim 1 further comprising:

fabricating a device structure on the substrate that incorporates the semiconducting carbon nanotubes.

13. The method of claim 1 wherein each of the semiconducting carbon nanotubes includes a free end and one of a plurality of third synthesis sites at the free end.

14. The method of claim 13 wherein each of the plurality of third synthesis sites originates from a corresponding one of the second plurality of synthesis sites at the time of nanotube nucleation.

15. The method of claim 13 further comprising:

forming a prophylactic barrier on the substrate to prevent synthesis of the conducting carbon nanotubes at the first plurality of synthesis sites after the first length is attained.

16. The method of claim 1 wherein said semiconducting carbon nanotubes are multi-wall semiconducting carbon nanotubes.

17. A method for producing semiconducting carbon nanotubes, comprising:
synthesizing conducting carbon nanotubes on a first plurality of synthesis sites carried by a substrate;
synthesizing semiconducting carbon nanotubes on a second plurality of synthesis sites carried by the substrate;
interrupting the synthesis of the conducting and the semiconducting carbon nanotubes;
altering the first plurality of synthesis sites to prevent resumed synthesis of the conducting carbon nanotubes; and
resuming the synthesis of semiconducting carbon nanotubes at the second plurality of synthesis sites to lengthen the semiconducting carbon nanotubes relative to the conducting carbon nanotubes.

18. The method of claim 17 wherein each of the first and second pluralities of synthesis sites includes a seed pad of a catalyst material capable of supporting carbon nanotube synthesis.

19. The method of claim 18 wherein altering the first plurality of synthesis sites comprises:
separating each of the conducting carbon nanotubes and the seed pad of the corresponding one of the first plurality of synthesis sites.

20. The method of claim 19 wherein separating each of the conducting carbon nanotubes comprises:
electrolytically etching the catalyst material forming the seed pad to an extent sufficient to separate each of the conducting carbon nanotubes and the seed pad of the corresponding one of the first plurality of synthesis sites.

21. The method of claim 18 wherein altering the first plurality of synthesis sites comprises:
covering the seed pad of each of the first plurality of synthesis sites with a plating barrier effective to prevent continued synthesis of the conducting carbon nanotubes.

22. The method of claim 17 wherein altering the first plurality of synthesis sites comprises:
performing an electrolytic etching process effective to separate each of the conducting carbon nanotubes and the corresponding one of the first plurality of synthesis sites.

23. The method of claim 17 wherein a single semiconducting carbon nanotube is carried by each of the second plurality of synthesis sites.

24. The method of claim 17 wherein synthesizing conducting carbon nanotubes comprises:
performing a chemical vapor deposition process on a catalyst material carried by each of the first plurality of synthesis sites.

25. The method of claim 17 wherein synthesizing semiconducting carbon nanotubes comprises:
performing a chemical vapor deposition process on a catalyst material carried by each of the second plurality of synthesis sites.

26. The method of claim 17 wherein resuming the synthesis of semiconducting carbon nanotubes comprises:
performing a chemical vapor deposition process on a catalyst material carried by each of the second plurality of synthesis sites.

27. The method of claim 17 further comprising:
harvesting the semiconducting carbon nanotubes lengthened by the resumed synthesis.

28. The method of claim 17 further comprising:
fabricating a device structure on the substrate that incorporates the semiconducting carbon nanotubes lengthened by the resumed synthesis.

29. The method of claim 17 further comprising after interrupting the synthesis and before altering the first plurality of synthesis sites:
coupling a conductive layer with corresponding free ends of the conducting carbon nanotubes and the semiconducting carbon nanotubes that is electrically isolated by a dielectric layer from the first and second pluralities of synthesis pads;
attaching the conductive layer to a handle wafer; and
separating the first and second pluralities of synthesis sites from the substrate.

30. The method of claim 29 further comprising:
recessing the dielectric layer by etching to expose the first and the second pluralities of synthesis sites.

31. The method of claim 17 wherein altering the first plurality of synthesis sites further comprises:
electrolytically etching the first plurality of synthesis sites to an extent sufficient to separate each of the conducting carbon nanotubes and the corresponding one of the first plurality of synthesis sites.

32. The method of claim 31 wherein electrolytically etching the first plurality of synthesis sites further comprises:
immersing the substrate in an electrolytic solution; and
applying an electrical current through the conducting carbon nanotubes effective to cause the electrolytic solution to etch each of the first plurality of synthesis sites at an interface with the corresponding one of the conducting carbon nanotubes.

33. The method of claim 32 wherein resuming synthesis further comprises:
performing a chemical vapor deposition process at the second plurality of synthesis sites effective to lengthen each corresponding semiconducting carbon nanotube.

34. The method of claim 17 wherein altering the first plurality of synthesis sites comprises:
covering each of the first plurality of synthesis sites with a plating barrier effective to prevent continued synthesis of the conducting carbon nanotubes.

35. The method of claim 34 wherein altering the first plurality of synthesis sites further comprises:
immersing the substrate in an electrolytic solution; and
applying an electrical current through the conducting carbon nanotubes effective to cause the plating barrier to cover each of the second plurality of synthesis sites.

36. The method of claim 35 wherein resuming synthesis further comprises:
performing a chemical vapor deposition process at the second plurality of synthesis sites effective to lengthen each corresponding semiconducting carbon nanotube.

37. The method of claim 17 wherein said semiconducting carbon nanotubes are multi-wall semiconducting carbon nanotubes.

38. A method for producing semiconducting carbon nanotubes, comprising:
synthesizing conducting carbon nanotubes on a first plurality of synthesis sites carried by a substrate, each of the conducting carbon nanotubes including a free end and one of a second plurality of synthesis sites at the free end;
synthesizing semiconducting carbon nanotubes on a second plurality of synthesis sites carried by the substrate, each of the semiconducting carbon nanotubes including a free end and one of a fourth plurality of synthesis sites at the free end;

interrupting the synthesis of the conducting and the semiconducting carbon nanotubes;

forming a prophylactic barrier on the substrate to prevent synthesis of the conducting carbon nanotubes at the first plurality of synthesis sites and the synthesis of semiconducting carbon nanotubes at the third plurality of synthesis sites;

altering the second plurality of synthesis sites to prevent resumed synthesis of the conducting carbon nanotubes; and resuming the synthesis of the semiconducting carbon nanotubes at the fourth plurality of synthesis sites to lengthen the semiconducting carbon nanotubes relative to the conducting carbon nanotubes.

39. The method of claim 38 wherein forming the prophylactic barrier further comprises:

burying the first, second, third and fourth pluralities of synthesis sites in a dielectric layer so that a synthesis-promoting reactant cannot reach said first and third pluralities of synthesis sites.

40. The method of claim 39 further comprising:

recessing the dielectric layer by etching to expose the second and fourth pluralities of synthesis sites.

41. The method of claim 40 wherein altering each of the second plurality of synthesis sites further comprises:

electrolytically etching each of the second plurality of synthesis sites to an extent sufficient to separate each of the conducting carbon nanotubes and the corresponding one of the second plurality of synthesis sites.

42. The method of claim 41 wherein electrolytically etching further comprises:

immersing the substrate in an electrolytic solution; and applying an electrical current through the conducting carbon nanotubes effective to cause the electrolytic solution to etch each of the second plurality of synthesis sites.

43. The method of claim 42 wherein resuming synthesis further comprises:

performing a chemical vapor deposition process at each of the fourth plurality of synthesis sites effective to lengthen the semiconducting carbon nanotubes.

44. The method of claim 40 wherein altering the second plurality of synthesis sites further comprises:

immersing the substrate in an electrolytic solution; and applying an electrical current through the conducting carbon nanotubes effective to form a plating barrier covering the second plurality of synthesis sites.

45. The method of claim 44 wherein resuming synthesis further comprises:

performing a chemical vapor deposition process at the fourth plurality of synthesis sites effective to lengthen the semiconducting carbon nanotubes.

46. The method of claim 38 wherein the second plurality of synthesis sites and the fourth plurality of synthesis sites originate from the corresponding one of the first plurality and the third plurality of synthesis sites, respectively, at the time of nanotube nucleation.

47. The method of claim 38 wherein altering the second plurality of synthesis sites comprises:

separating each of the conducting carbon nanotubes and the corresponding one of the second plurality of synthesis sites.

48. The method of claim 47 wherein separating each of the conducting carbon nanotubes comprises:

electrolytically etching the catalyst material forming the second plurality of synthesis sites to an extent sufficient to separate each of the conducting carbon nanotubes from the corresponding one of the second plurality of synthesis sites.

49. The method of claim 38 wherein altering the second plurality of synthesis sites comprises:

form a plating barrier covering the second plurality of synthesis sites effective to prevent continued synthesis of the conducting carbon nanotubes.

50. The method of claim 38 wherein a single semiconducting carbon nanotube is carried by each of the third plurality of synthesis sites.

51. The method of claim 38 wherein synthesizing conducting carbon nanotubes comprises:

performing a chemical vapor deposition process at the first plurality of synthesis sites.

52. The method of claim 38 wherein synthesizing semiconducting carbon nanotubes comprises:

performing a chemical vapor deposition process at the third plurality of synthesis sites.

53. The method of claim 38 wherein resuming the synthesis of semiconducting carbon nanotubes comprises:

performing a chemical vapor deposition process at the fourth plurality of synthesis sites.

54. The method of claim 38 further comprising:

harvesting the semiconducting carbon nanotubes lengthened by the resumed synthesis.

55. The method of claim 38 further comprising:

fabricating a device structure on the substrate that incorporates the semiconducting carbon nanotubes lengthened by the resumed synthesis.

56. The method of claim 38 wherein said semiconducting carbon nanotubes are multi-wall semiconducting carbon nanotubes.

57. A structure comprising:

a substrate carrying a plurality of first and a plurality of second synthesis sites each configured for synthesizing carbon nanotubes;

a plurality of semiconducting carbon nanotubes each carried by one of the first plurality of synthesis sites; and a plurality of conducting carbon nanotubes each carried by one of the second plurality of synthesis sites, each of said plurality of conducting carbon nanotubes characterized by a first length less than a second length characterizing each of said plurality of semiconducting carbon nanotubes.

58. The structure of claim 57 wherein each of said second plurality of synthesis sites carries one of said plurality of semiconducting carbon nanotubes.

59. The structure of claim 57 wherein each of said plurality of semiconducting carbon nanotubes includes a free end and one of a third plurality of synthesis sites at the free end capable of supporting semiconducting carbon nanotube synthesis.

60. The structure of claim 59 wherein a free end of each of said plurality of conducting carbon nanotube lacks a synthesis site.

61. The structure of claim 59 further comprising:

a dielectric layer burying said first and second pluralities of synthesis sites so that a synthesis-promoting reactant cannot reach said first and second pluralities of synthesis sites.

62. The structure of claim 57 wherein a single semiconducting carbon nanotube is carried by each of said second plurality of synthesis sites.

63. The structure of claim 57 wherein said second length is at least twice as long as said first length.

64. The structure of claim 63 wherein said first length is in the range of about 100 nm to about 200 nm.

65. The structure of claim 57 wherein said semiconducting carbon nanotubes are multi-wall semiconducting carbon nanotubes.

* * * * *